(12) United States Patent
Crowley et al.

(10) Patent No.: US 6,753,597 B1
(45) Date of Patent: Jun. 22, 2004

(54) ENCAPSULATED SEMICONDUCTOR PACKAGE INCLUDING CHIP PADDLE AND LEADS

(75) Inventors: Sean Timothy Crowley, Phoenix, AZ (US); Angel Orabuena Alvarez, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,495

(22) Filed: Oct. 13, 2000

(30) Foreign Application Priority Data

Dec. 16, 1999 (KR) ........................................ 1999-58164

(51) Int. Cl.[7] ........................ H01L 23/495; H01L 23/02
(52) U.S. Cl. ........................ 257/676; 257/667; 257/787
(58) Field of Search ................................ 257/666, 667, 257/670, 672, 673, 674, 676, 677, 678, 690, 787

(56) References Cited

U.S. PATENT DOCUMENTS

| | | | |
|---|---|---|---|
| 4,530,152 A | | 7/1985 | Roche et al. ................ 29/588 |
| 5,041,902 A | | 8/1991 | McShane .................... 357/79 |
| 5,157,480 A | | 10/1992 | McShane et al. ............ 357/74 |
| 5,172,213 A | * | 12/1992 | Zimmerman ................ 257/796 |
| 5,172,214 A | * | 12/1992 | Casto ........................ 257/676 |
| 5,278,446 A | | 1/1994 | Nagaraj et al. ............. 257/707 |
| 5,428,248 A | | 6/1995 | Cha ........................... 257/676 |
| 5,521,429 A | * | 5/1996 | Aono et al. ................. 257/676 |
| 5,528,076 A | * | 6/1996 | Pavio ......................... 257/666 |

(List continued on next page.)

FOREIGN PATENT DOCUMENTS

| | | |
|---|---|---|
| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |

(List continued on next page.)

*Primary Examiner*—Evan Pert
*Assistant Examiner*—Scott B. Geyer
(74) *Attorney, Agent, or Firm*—Stetina Brunda Garred & Brucker (57) ABSTRACT

A semiconductor package that can accommodate a larger semiconductor chip while keeping the foot print area afforded to a conventional semiconductor package. The semiconductor package of the present invention also has an improved locking strength between a chip paddle and an encapsulation material. Additionally, the semiconductor chip of the present invention exhibits an improved heat radiation of the semiconductor chip over conventional semiconductor packages. The package of the present invention comprises a semiconductor chip having a plurality of bond pads on its upper surface; a chip paddle bonded to the bottom surface of the semiconductor chip by an adhesive; a plurality of internal leads, each having an etched part at the end facing the chip paddle, which are formed at regular intervals along the perimeter of the chip paddle; conductive wires for electrically connecting the bond pads of the semiconductor chip to the internal leads; and a package body in which the semiconductor chip, the conductive wires, the chip paddle and the internal leads are encapsulated by an encapsulation material while the chip paddle and the internal leads are externally exposed at their side surfaces and bottom surfaces.

11 Claims, 4 Drawing Sheets

U.S. PATENT DOCUMENTS

| | | | |
|---|---|---|---|
| 5,701,034 A | 12/1997 | Marrs | 257/706 |
| 5,783,861 A | 7/1998 | Son | 253/693 |
| 5,835,988 A | 11/1998 | Ishii | 257/684 |
| 5,866,939 A | 2/1999 | Shin et al. | 257/666 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,143,981 A | 11/2000 | Glenn | 174/52.4 |
| 6,211,462 B1 * | 4/2001 | Carter, Jr. et al. | 174/52.4 |
| 6,229,200 B1 | 5/2001 | Mclellan et al. | 257/666 |
| 6,242,281 B1 | 6/2001 | Mclellan et al. | 438/106 |
| 6,294,100 B1 | 9/2001 | Fan et al. | 216/14 |
| 6,355,502 B1 | 3/2002 | Kang et al. | 438/110 |
| 6,420,779 B1 * | 7/2002 | Sharma et al. | 257/666 |

FOREIGN PATENT DOCUMENTS

| | | |
|---|---|---|
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

\* cited by examiner

ENCAPSULATED SEMICONDUCTOR PACKAGE INCLUDING CHIP PADDLE AND LEADS

BACKGROUND OF THE INVENTION

1. Field of the Invention

The present invention relates, in general, to semiconductor packages and, more particularly, but not by way of limitation, to a semiconductor package that can accommodate a larger semiconductor chip without increasing the foot print area afforded to a conventional semiconductor package. Additionally, the present invention relates to a semiconductor package having an increased moisture path.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal lead frames for supporting an integrated circuit chip which is bonded to a chip paddle region formed centrally therein. Bond wires which electrically connect pads on the integrated circuit chip to individual leads of the lead frame are then incorporated. A hard plastic encapsulating material, or encapsulate, which covers the bond wire, the integrated circuit chip and other components, forms the exterior of the package. A primary focus in this design is to provide the chip with adequate protection from the external environment in a reliable and effective manner.

As set forth above, the semiconductor package herein described incorporates a lead frame as the central supporting structure of such a package A portion of the lead frame completely surrounded by the plastic encapsulate is internal to the package Portions of the lead frame extend internally from the package and are then used to connect the package externally. More information relative to lead frame technology may be found in Chapter 8 of the book *Micro Electronics Packaging Handbook*, (1989), edited by R. Tummala and E. Rymaszewski, incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, which results in increased consumer demand. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

A micro electronic circuit with a significant number of semiconductor chips is designed to conduct multiple functions in a minimal period of time. Additionally, semiconductor packages have become increasingly miniaturized with an increase in semiconductor package mounting density.

Demand for higher-speed, slimmer, and multi-functional electric appliances has lead to the development of semiconductor chips that have a high memory capacity without increasing thickness of the semiconductor chip. However, to achieve high memory capacity, the semiconductor chips must have an increased size. Therefore, to utilize slim semiconductor packages with multi-pins, there is a need for a technique of mounting the larger semiconductor packages.

A conventional small outline integrated circuit (SOIC) type semiconductor package is a surface-mounting type semiconductor package Other types include a small outline J-bend (SOJ) type, a small outline package (SOP) type, and a quad flat package (QFF) type semiconductor package. Similar in structure to the SOIC type, these semiconductor packages differ from one to another only in the bend shape.

An SOIC type semiconductor package comprises a semiconductor chip, which has a plurality of bond pads on its upper surface along its perimeter, and a chip paddle that is bonded to the bottom surface of the semiconductor chip via a conductive or non-conductive adhesive. A plurality of internal leads are arranged at regular intervals along the opposite sides of the semiconductor chip. External leads, which are bent in a seagull wing shape, are extended from the internal leads. Via conductive wires, such as gold or aluminum wires, bond pads of the semiconductor chip are electrically connected to the internal leads.

The semiconductor chip, the chip paddle, the conductive wires and the internal leads are encapsulated by an encapsulation material, such as an epoxy resin or resinous encapsulation material, to create a package body that has the function of preventing the internal components from being damaged by external factors, such as dust, heat, moisture, electrical and mechanical loads, etc. Typically, the chip paddle, the internal leads and the external leads are made of copper (Cu) or alloy, collectively composing a leadframe.

While an area of the upper surface of the internal lead is plated with copper (Cu) to improve the bonding strength with the conductive wires, an area of the external lead, which is to be fused onto a motherboard by soldering, is plated with nickel (Ni), tin (Sn), or palladium (Pd).

As described above, the conventional semiconductor package, in which the chip paddle occupies a larger space than does the semiconductor chip, has such a structure that results in difficulties with regard to securing a space for a large-size semiconductor chip. This is because the internal leads are spaced at regular intervals from each other and at a predetermined distance from the chip paddle.

Additionally, the internal leads formed in the semiconductor package are further extended over the package body from its front and rear sides or its front, rear, left and right sides. Thus, when such a semiconductor package is mounted on a motherboard, the semiconductor package occupies a significantly large space, which results in a decreased packaging density as well as adversely affecting design tolerance of electric patterns.

Further, when a large-size semiconductor chip is mounted in a semiconductor package of such a structure, the semiconductor package must be enlarged, which decreases packaging density as well as increasing the size of the motherboard to accommodate the larger semiconductor chip. Thus, the motherboard's foot print area to which the external leads of the semiconductor package are fused must be re-designed.

A further drawback of conventional semiconductor chip design is that the semiconductor chip is completely encapsulated within a package body formed of a resinous material, which results in a very poor heat radiation ability.

BRIEF SUMMARY OF THE INVENTION

The present invention relates to semiconductor packages that can accommodate a larger semiconductor chip. More particularly, one aspect of an embodiment of the present invention includes a semiconductor package comprising a semiconductor chip having a plurality of bond pads on its upper surface, a chip paddle bonded to the bottom surface of the semiconductor chip via an adhesive, and a plurality of leads, each having a lead etched part at the end facing the chip paddle. The leads are formed at regular intervals along the perimeter of the chip paddle. Conductive wires electrically connect the bond pads of the semiconductor chip to the leads. A package body houses the semiconductor chip, the conductive wires, the chip paddle and the leads, which are encapsulated by an encapsulation material while the chip paddle and the leads are externally exposed at their side surfaces and bottom surfaces. In one embodiment of the present invention, a lower side area of the chip paddle is etched to the extent that the resulting paddle etched part amounts to 10–90% of the total area of the lower side area with preference to a location at the inside of the lower side area of the chip paddle. While the chip paddle and the lower surfaces of the leads are preferably in a common plane, the chip paddle may be thicker than the leads.

In another aspect, the semiconductor package of the present invention has a noticeable advantage over conventional SOIC type semiconductor packages, in that the semiconductor of the present invention can use a 3.5 folds larger semiconductor chip with the same volume as that of the conventional type semiconductor packages. In addition, in the semiconductor package of the present invention, the bottom surface of the lead, i.e., the position at which lands are formed, may be the same position at which the external leads are fused to the motherboard, so that a conventional foot print area can be utilized Therefore, no design modification on the motherboard is required.

Moreover, the semiconductor package of the present invention shows excellent heat radiation due to its bottom surface being exposed to the outside. Further, the paddle etched part formed in the chip paddle brings about a remarkable improvement in the locking force between the chip paddle and the package body and in the fluidity of an encapsulation material during an encapsulation process. Additionally, the passage through which moisture permeates the semiconductor package is lengthened to minimize the influence of moisture on the semiconductor package. Typically, moisture permeates a semiconductor package at the interface between the encapsulate material and an exposed component, such as the chip paddle.

BRIEF DESCRIPTION OF THE DRAWINGS

The above and other objects, features and other advantages of the various embodiments of the present invention will be more clearly understood from the following detailed description, with like reference numerals denoting like elements, taken in conjunction with the accompanying drawings, in which.

DETAILED DESCRIPTION OF THE INVENTION

The present invention may be understood more readily by reference to the following detailed description of preferred embodiments of the present invention and the figures.

Figure 1:
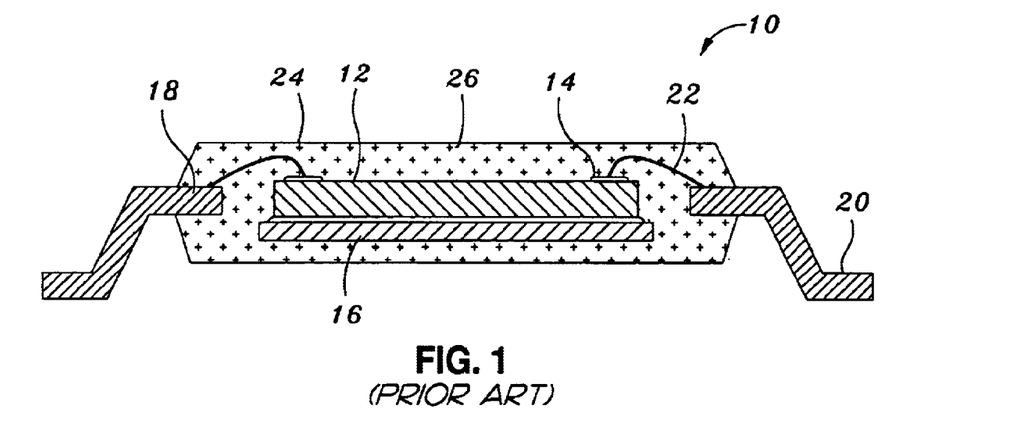
FIG. 1 shows a cross-section of a conventional semiconductor package.
Figure 2:
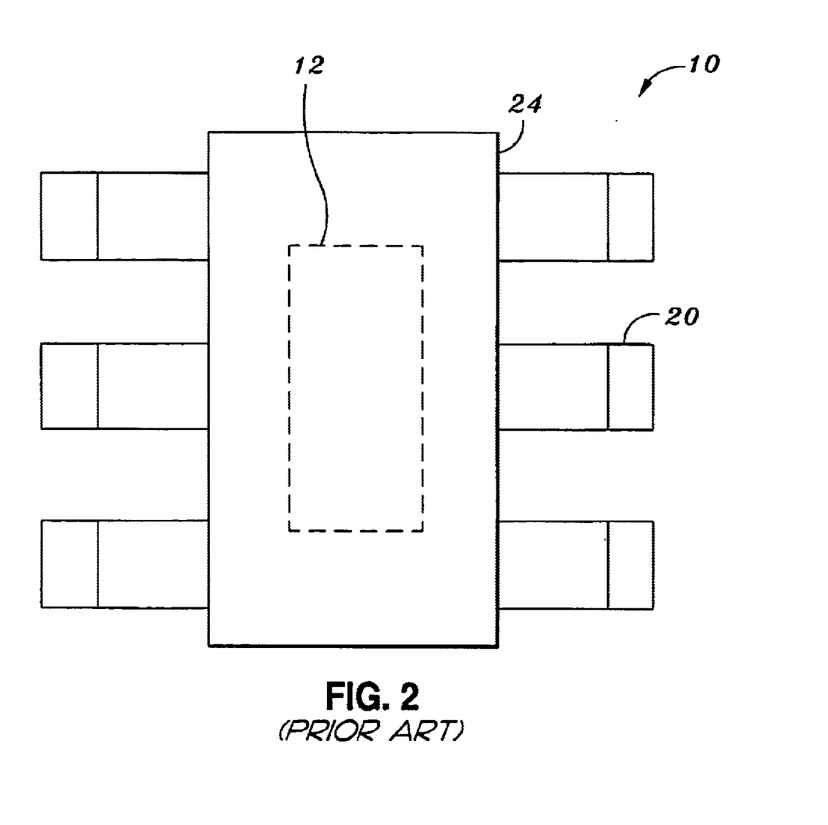
FIG. 2 is a top view of the conventional semiconductor package of FIG. 1.

Referring now to FIGS. 1 and 2, FIG. 1 shows a cross sectional view of a conventional small outline integrated circuit (SOIC) type semiconductor package 10, which is a surface-mounting type semiconductor package. FIG. 2 shows the conventional SOIC semiconductor package 10 in a top view. As shown, conventional SOIC type semiconductor package 10 comprises a semiconductor chip 12 that has a plurality of bond pads 14 on its upper surface along its perimeter, and a chip paddle 16. Chip paddle 16 is preferably bonded to the bottom surface of the semiconductor chip 12 via a conductive or non-conductive adhesive. A plurality of internal leads 18, are arranged at regular intervals along opposite sides of the semiconductor chip 12. External leads 20, which are bent in a seagull wing shape, are extended from the internal leads 18. Conductive wires 22 are electrically connected to the internal leads 18. Conductive wires 22 are preferably made of gold or aluminum, although other materials may be used. The bond pads 14 of the semiconductor chip 12 are electrically connected to the internal leads 18.

The semiconductor chip 12, the chip paddle 16, the conductive wires 22 and the internal leads 18 are encapsulated by an encapsulation material 26, to create a package body 24, which has the function of preventing the internal constituents from being damaged by external factors, such as dust, heat, moisture, electrical and mechanical loads, etc.

Typically, the chip paddle 16, the internal leads 18 and the external leads 20 are made of copper (Cu), an alloy, or other conductive material. The chip paddle 16, the internal leads 18 and the external leads 20 collectively compose a leadframe.

An area of the upper surface of the internal lead 18 is preferably plated with copper (Cu) to improve the bonding strength with the conductive wires 22. An area of the external lead 20, which is to be fused onto a motherboard by soldering, is plated with nickel (Ni), tin (Sn), palladium (Pd), or other similar material.

As described, conventional semiconductor package 10 has a chip paddle 16 that occupies a larger space than does the semiconductor chip 12. Therefore, conventional semiconductor package 10 has such a structure that it is not ideal for securing a large-size semiconductor chip thereto since the internal leads 18 are spaced at regular intervals from one another and at a predetermined distance from the chip paddle 16.

In addition, the internal leads 18 that are formed in the conventional semiconductor package 10 are further extended over the package body 24 from its front and rear sides or its front, rear, left and right sides. Thus, when conventional semiconductor package 10 is mounted on a motherboard, the conventional semiconductor package 10 occupies a significantly large space, causing problems of decreasing packaging density on a motherboard, as well as problems related to design tolerance of electric patterns.

Further, when a large-size semiconductor chip is mounted in a conventional semiconductor package 10, the semiconductor package 10 must be enlarged, which causes a decrease in packaging density as well as an increase in the size of the motherboard. Thus, the foot print area of a motherboard to which the external leads 20 of the semiconductor package 10 are fused must be re-designed. Moreover, the semiconductor chip 12, which is thoroughly encapsulated within the package body 24 is very poor in heat radiation ability.

Figure 3:
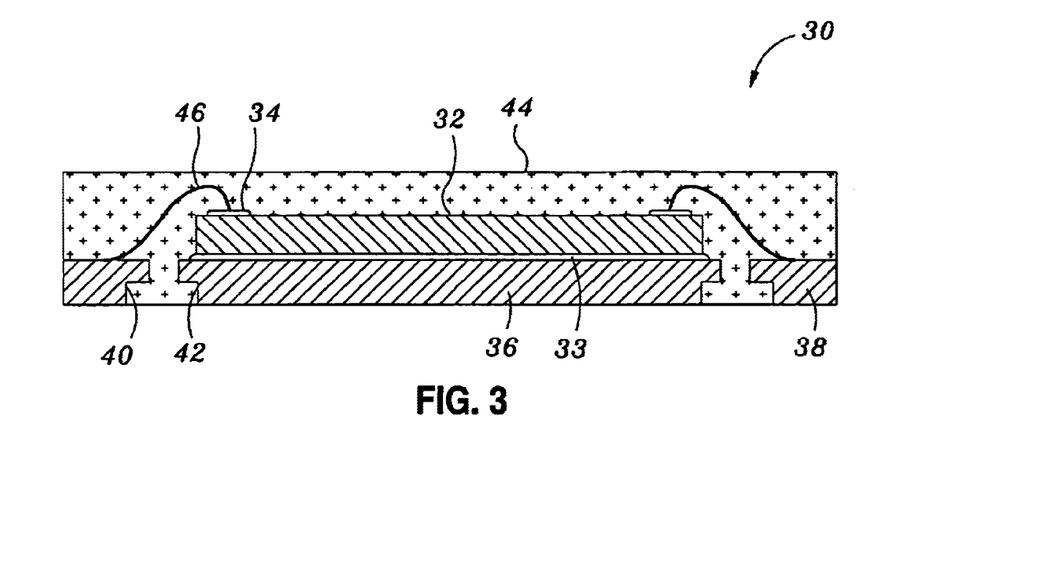
FIG. 3 is a cross-section of a semiconductor package according to an embodiment of the present invention.
Figure 4:
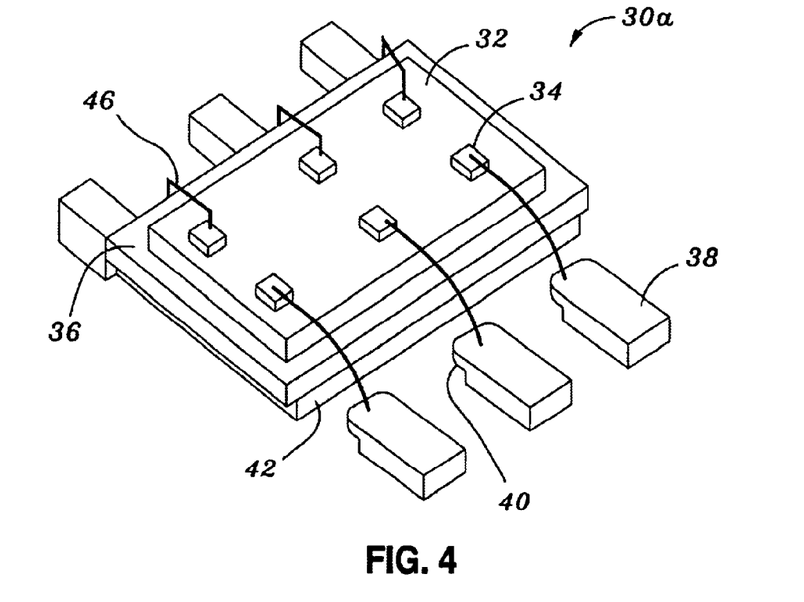
FIG. 4 is a perspective view of a semiconductor package according to an embodiment of the present invention wherein the semiconductor package is deprived of a package body.

Referring now to FIGS. 3 and 4, FIG. 3 shows a cross section of a semiconductor package 30 according to an embodiment of the present invention. FIG. 4 shows a perspective view of the semiconductor package 30a deprived of a package body.

As shown in FIG. 3, the semiconductor package 30 comprises a semiconductor chip 32 that has a plurality of bond pads 34 on its upper surface along its perimeter, and a chip paddle 36, which is bonded to the bottom surface of the semiconductor chip 32 via a conductive or non-conductive adhesive 33.

Along the perimeter of the chip paddle 36, a plurality of leads 38 are arranged at regular intervals Leads 38 are as thick as the chip paddle 36 so that the upper surface of the lead 38 and the upper surface of the chip paddle 36 are in the same plane while the bottom surface of the lead 38 and the bottom surface of the chip paddle 36 are in the same plane At an end facing the chip paddle 36, each of the leads 38 has a lead etched part 40 that is thinner than the lead 38 itself. Likewise, a lower side area of the chip paddle 36 is etched to the extent that the resulting paddle etched part 42 amounts to 10–90% of the total area of the chip paddle 36, which results in an improvement in the locking strength to a package body 44 and the fluidity of an encapsulation material during the encapsulation step and minimizing the influence of moisture on the semiconductor package 30. The influence of moisture is minimized by lengthening the passage through which moisture permeates the semiconductor package 30. An electrical connection is formed between the bond pads 34 of the semiconductor chip 32 and the leads 38 through conductive wires 46. Conductive wires 46 are preferably made of gold or aluminum, although other materials may be used.

The semiconductor chip 32, the conductive wires 46, the chip paddle 36 and the leads 38 are encapsulated into a package body 44 wherein the bottom surface of the chip paddle 36 and the bottom surface of the leads 38 are in the same plane and are externally exposed in the downward direction of the package body 44. By being directly exposed to the outside of the package body 44, the semiconductor chip 32 exhibits improved heat radiation abilities as compared with conventional semiconductor chips, such as conventional semiconductor packages, such as semiconductor chip 12 (FIGS. 1 and 2). Typically, the chip paddle 36 and the leads 38 are made of copper (Cu) or alloy, although other materials may be used.

The sides of the leads 38 and the side of the package body 44 form one plane, with the aim of securing a maximum volume in the package body 44 to protect the semiconductor chip 32 and the conductive wires 46. Additionally, the inside surfaces of the leads 38 have lead etched parts 40 to improve the locking strength between the leads 38 and the package body 44.

Figure 5:
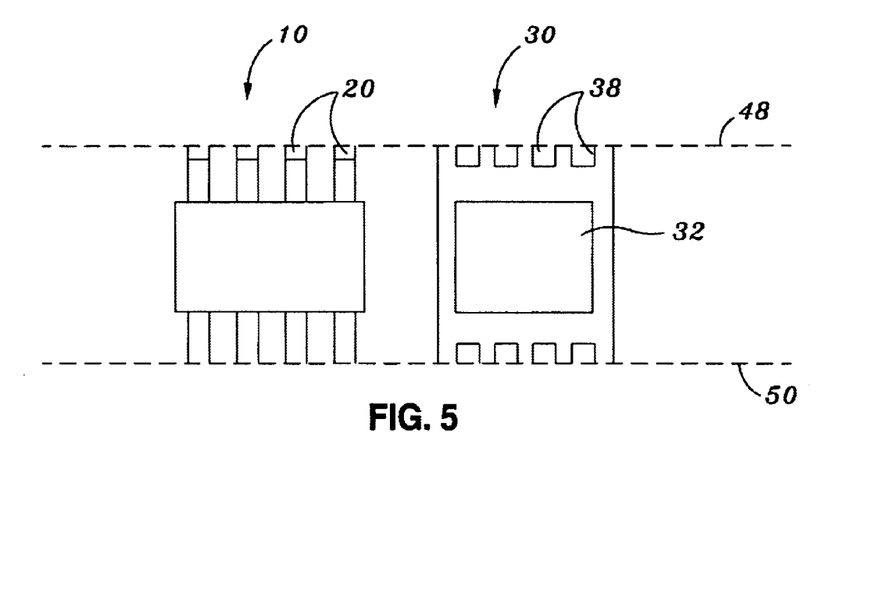
FIG. 5 is a top view of a conventional semiconductor package of FIGS. 1 and 2 and the semiconductor package of FIG. 3 showing that the two packages have the same foot print.

Referring now to FIG. 5, a top view of conventional semiconductor package 10 is shown adjacent to a bottom view of the semiconductor package 30 of the present invention. Reference lines 48 and 50 clearly indicate that conventional semiconductor package 10 and the semiconductor package 30 of the present invention have the same foot print. More particularly, it can be seen that leads 20 of conventional semiconductor package 10 extend outwardly to reference line 48 above conventional semiconductor package 10 and to reference line 50 below conventional semiconductor package 10. Similarly, leads 38 of the semiconductor package 30 of the present invention extend to reference line 48 above semiconductor package 30 and to reference line 50 below semiconductor package 30.

Figure 6:
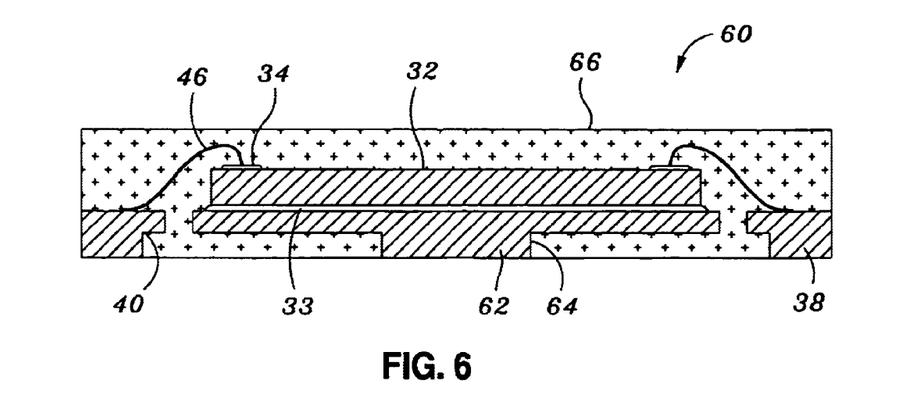
FIG. 6 is a cross-section of another embodiment of a semiconductor package according to the present invention.
Figure 7:
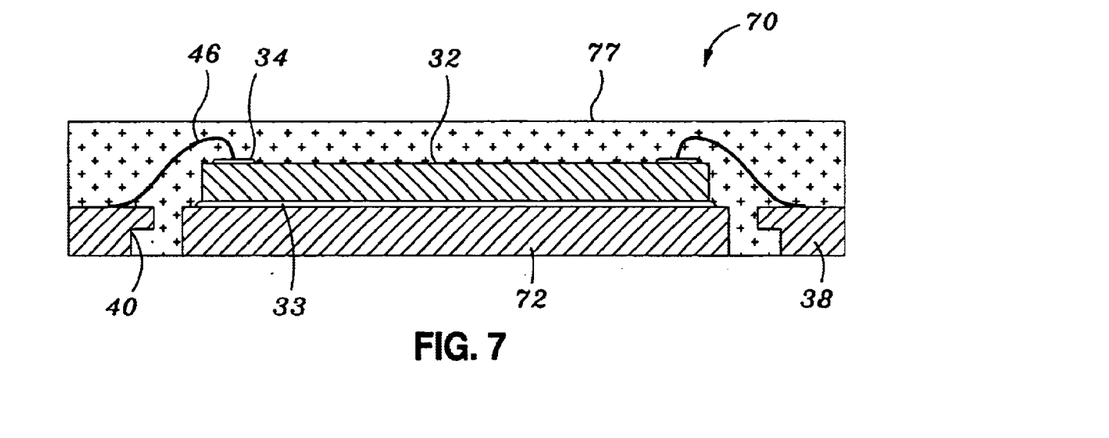
FIG. 7 is a cross-section of another embodiment of a semiconductor package according to the present invention.
Figure 8:
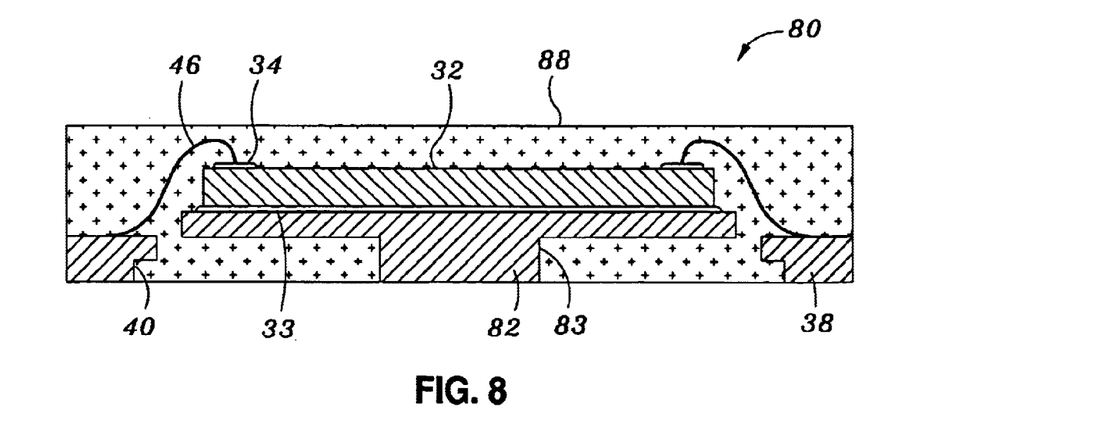
FIG. 8 is a cross-section of another embodiment of a semiconductor package according to the present invention.

Referring now to FIGS. 6 through 8, shown are alternate embodiments of semiconductor packages of the present invention. Because of similarities in many structural features to the semiconductor package 30 of FIGS. 3 and 4, the semiconductor packages of FIGS. 6 through 8 will be described only for different structural features and similar features will retain the same numerical designations as the embodiment of FIG. 3.

Referring now to FIG. 6, semiconductor package 60 has a chip paddle 62, a lower side area of which is etched to the extent that a resulting paddle etched part 64 amounts to 10–90% of the total area of the chip paddle 62. The paddle etched part 64 provides the chip paddle 62 with additional areas that can be adhered to a package body 66 to improve the locking force between the chip paddle 62 and the package body 66. Additionally, the paddle etched part 64 allows the encapsulating material to flow smoothly and has the effect of lengthening the passage through which moisture infiltrates the semiconductor package 60, so as to reduce problems attributed to moisture permeation on the semiconductor package 60, such as interfacial exfoliation or delamination and "popcorning" of the package.

Referring now to FIG. 7, shown is another alternate embodiment of a semiconductor package 70. Semiconductor package 70 has a chip paddle 72 with no etched parts on the lower surface of the chip paddle 72. Chip paddle 72 can easily radiate heat generated from the semiconductor chip 32 because of the enlarged exposed surface area on the lower surface of the chip paddle 72.

Referring now to FIG. 8, a further embodiment of a semiconductor package of the present invention is designated generally semiconductor package 80. A chip paddle 82 is formed at a thickness different from that of the lead 38. The bottom surface of the chip paddle 82 and the bottom surface of the lead 38 are in a common plane. However, an upper surface of the chip paddle 82 is positioned at a higher level than is an upper surface of the leads 38. The chip paddle 82 is preferably 1.1–2.5 times as thick as the leads 38. Further, a lower side area of the chip paddle 82 is etched. A paddle etched part 83 preferably has a thickness similar to that of the lead 38, so as to significantly improve the locking strength between the chip paddle 82 and a package body 88 as well as the fluidity of the encapsulation material upon the encapsulating. Preferably, the paddle etched part 83 amounts to 10–90% of the total area of the lower surface of the chip paddle 82.

Additionally, other embodiments are possible. For example, a semiconductor chip that is extended to the surface of the lead may be utilized. In this instance, the upper surface of the chip paddle forms a plane along with the upper surface of the leads. Alternatively, when the leads are positioned at a lower level than the semiconductor chip, the semiconductor chip can be mounted onto the chip paddle without the chip being limited to the size of the paddle. In such a case, a non-conductive adhesive tape is preferably used as the adhesive by which the semiconductor chip is bonded on the chip paddle or to the lead.

Additionally, a semiconductor package according to the present invention has improved locking strength between a chip paddle and an encapsulation material. Further, the present invention provides a semiconductor package that exhibits improved heat radiation of a semiconductor chip. In addition, in a semiconductor package of the present invention, the bottom surface of the lead, i.e., the position at which lands are formed, may have the same position at which the external leads are fused to the motherboard, so that a conventional foot print area can be utilized.

Moreover, the semiconductor package of the present invention shows excellent heat radiation on account of its bottom surface being exposed to the exterior of the semiconductor package. Further, the paddle etched part formed in the chip paddle brings about a remarkable improvement in the locking force between the chip paddle and the package body and in the fluidity of an encapsulation material during an encapsulation process. Additionally, the paddle etched part lengthens the passage through which moisture permeates the semiconductor package to minimize the influence of moisture on the semiconductor package.

The following applications are all being filed on the same date as the present application and all are incorporated by reference as if wholly rewritten entirely herein, including any additional matter incorporated by reference therein:

| Application Number | Title of Application | First Named Inventor |
|---|---|---|
| 09/687,485 | Semiconductor Package Having Increased Solder Joint Strength | Kil Chin Lee |
| 09/687,487 | Clamp and Heat Block Assembly For Wire Bonding a Semiconductor Package Assembly | Young Suk Chung |
| 09/687,876 | Near Chip Size Semiconductor Package | Sean Timothy Crowley |
| 09/687,531 | Stackable Semiconductor Package and Method for Manufacturing Same | Sean Timothy Crowley |
| 09/687,530 | Stackable Semiconductor Package and Method for Manufacturing Same | Jun Young Yang |
| 09/687,126 | Method of and Apparatus for Manufacturing Semiconductor Packages | Hyung Ju Lee |
| 09/687,493 | Semiconductor Package Having Improved Adhesiveness and Ground Bonding | Sung Sik Jang |

-continued

| Application Number | Title of Application | First Named Inventor |
|---|---|---|
| 09/687,541 | Semiconductor Package Leadframe Assembly and Method of Manufacture | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the present invention.

What is claimed is:

1. A semiconductor package, comprising:

a semiconductor chip having an upper surface provided with a plurality of input/output pads thereon;

a chip paddle adjacent a bottom surface of the semiconductor chip, the chip paddle having an upper surface and a lower surface;

a plurality of leads surrounding the chip paddle and having upper and lower surfaces, wherein the chip paddle has a maximum thickness which exceeds a maximum thickness of each of the leads and the upper surfaces of the leads reside on a common plane which extends between the upper and lower surfaces of the chip paddle;

conductive wires for electrically connecting the input/output pads of the semiconductor chip to the leads; and a package body comprised of an encapsulation material that encapsulates the semiconductor chip, the conductive wires, the chip paddle and the leads, wherein at least portions of the lower surfaces of the chip paddle and the leads are externally exposed in a common exterior surface of the package body.

2. The semiconductor package as set forth in claim 1, wherein:

the lower surface of the chip paddle and the lower surface of each of the leads are in a common plane.

3. The semiconductor package as set forth in claim 1, wherein:

the chip paddle is bonded to a bottom surface of the semiconductor chip with an adhesive.

4. The semiconductor package as set forth in claim 1, wherein:

each of the leads has an etched part at an end facing the chip paddle.

5. A packaged semiconductor, comprising:

a chip paddle adapted to receive a semiconductor chip, said chip paddle having an upper surface, a lower surface, and an intermediate surface positioned between and parallel to the upper surface and the lower surface, the lower and intermediate surfaces collectively defining a lower side area of the chip paddle, the intermediate surface being about 10% to about 90% of the lower side area;

a plurality of leads surrounding the chip paddle, the chip paddle and the leads comprising a leadframe wherein the intermediate surface of the chip paddle and at least one portion of an upper surface of each of the leads are in approximately a common plane, and wherein the chip paddle has a maximum thickness which exceeds a maximum thickness of each of the leads; and the leadframe being adapted to receive a package body comprised of encapsulation material for encapsulating the chip paddle and the leads, wherein portions of the chip paddle and the leads are externally exposed in the package body and the intermediate surface of the chip paddle is located inside the package body.

6. The packaged semiconductor as set forth in claim 5, wherein:

each of the leads has an etched part at an end facing the chip paddle.

7. The packaged semiconductor as set forth in claim 5, wherein:

each of the leads has a lower surface which is externally exposed in the package body.

8. A package for mounting a semiconductor chip, comprising:

a leadframe, comprising:

a chip paddle defining a lower side area and an etched portion in the lower side area, wherein the etched portion is about 10% to about 90% of the lower side area and a surface of the chip paddle is externally exposed in the package; and a plurality of leads surrounding the chip paddle, wherein a surface of each of the plurality of leads is externally exposed in the package;

means for receiving encapsulating material for encapsulating the leadframe;

means for locking the encapsulating means to the chip paddle;

means for providing a fluid path for the encapsulating means during encapsulation of the leadframe; and said means for locking and said means for providing a fluid path being formed from a void caused by said chip paddle being of a maximum thickness which exceeds a maximum thickness of each of the leads.

9. The package as set forth in claim 8, wherein the means for locking comprises the etched portion.

10. The package as set forth in claim 8, wherein the means for providing a fluid path comprises the etched portion.

11. The package as set forth in claim 8, wherein the etched portion is located inside the package body, a lower surface of the chip paddle and a lower surface of each of the plurality of leads are in approximately a common plane, the chip paddle is bonded to bottom surface of a semiconductor chip and at least one of the plurality of leads has an etched part at an end facing the chip paddle.

* * * * *